(12) United States Patent
Hansson

(10) Patent No.: US 6,269,138 B1
(45) Date of Patent: Jul. 31, 2001

(54) LOW POWER COUNTERS

(75) Inventor: Mattias Hansson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/311,341

(22) Filed: May 13, 1999

(30) Foreign Application Priority Data

May 18, 1998 (SE) .................................................. 9801738

(51) Int. Cl.[7] .................................................. G06M 3/00
(52) U.S. Cl. .................................. 377/26; 377/34; 377/116
(58) Field of Search .................................. 377/34, 26, 116

(56) References Cited

U.S. PATENT DOCUMENTS

| 3,783,306 | 1/1974 | Hoffman . |
| 4,780,894 | * 10/1988 | Watkins et al. ........................ 377/34 |
| 5,164,968 | * 11/1992 | Otto ........................................ 377/34 |

FOREIGN PATENT DOCUMENTS

96/25701  2/1996  (WO) .

OTHER PUBLICATIONS

IBM Technical Disclosure Bulletin, vol. 7, No. 7, Dec. 1964, A. Cutaia, "Gray Code Generator", pp. 587–588.

* cited by examiner

*Primary Examiner*—Margaret R. Wambach
(74) *Attorney, Agent, or Firm*—Burns, Doane, Swecker & Mathis, L.L.P.

(57) ABSTRACT

A low power counter for cycling through a predetermined sequence of states in response to pulses on an input line includes a number of counter blocks, corresponding to the number of bits of the counter, connected in series. The low power counter blocks include memory devices consuming a minimum of power when they are disabled and activated only when the value of the respective data output connection has to be changed.

6 Claims, 6 Drawing Sheets

| State | Binary coded state | Gray coded state |
|---|---|---|
| 0 | 0000 | 0000 |
| 1 | 0001 | 0001 |
| 2 | 0010 | 0011 |
| 3 | 0011 | 0010 |
| 4 | 0100 | 0110 |
| 5 | 0101 | 0111 |
| 6 | 0110 | 0101 |
| 7 | 0111 | 0100 |
| 8 | 1000 | 1100 |
| 9 | 1001 | 1101 |
| 10 | 1010 | 1111 |
| 11 | 1011 | 1110 |
| 12 | 1100 | 1010 |
| 13 | 1101 | 1011 |
| 14 | 1110 | 1001 |
| 15 | 1111 | 1000 |

FIG. 3

|                  | RCA Binary | Low Power Binary | GB Gray | Low Power Gray |
|------------------|------------|------------------|---------|----------------|
| Size             | 81.25      | 98.50            | 122.75  | 206            |
| Power Dissipated | 54.28      | 25.39            | 70.69   | 28.82          |

LOW POWER COUNTERS

This application claims priority under 35 U.S.C. §§119 and/or 365 to 9801738-7 filed in Sweden on May 18, 1998; the entire content of which is hereby incorporated by reference.

The present invention generally relates to counters and counter blocks and more particularly to low power counters and counter blocks.

BACKGROUND

Counters are used in many different electronic apparatuses such as computers, calculators, personal organisers, mobile phones etc.

A counter is a sequential machine designed to cycle through a predetermined sequence of states in response to pulses on an input line. The states usually represent consecutive numbers. There are many different counters available depending on the number code used, the modulus, and the timing mode.

Counters can be either synchronous or asynchronous (or ripple clock counters).

A conventional 4-bit or modulo-16 binary counter is composed of four JK flip-flops. The counter counts pulses on the count enable line or clock input. The output is a 4-bit binary number. A synchronous counter is characterized in that the count enable line of every flip-flop is connected to the same clock source.

In an asynchronous counter the output of some flip-flops is connected to the count enable input of its right neighbour or the more significant bit so that it may alter the state of that neighbour flip-flop. Thus, carry signals ripple through the counter from left to right. Therefore, an asynchronous counter is also called a ripple counter.

A problem with the above mentioned prior art counter designs is that when they are used in applications or apparatuses, such as mobile phones, where power consumption is critical, the power consumption in the flip-flops in the counters is a considerable portion of the total power consumption in the current apparatus.

U.S. Pat. No. 5,585,745 discloses methods and apparatus for reducing the power consumption of personal computers. A power controller reduces power by deactivating functional blocks that are not needed as indicated by clock control signals. Control signals are received from a number of functional blocks, a particular functional block is deactivated upon a request from that functional block or from another functional block, and the particular functional block is activated upon request from another funtional block. Each functional block consumes less power when deactivated than when activated. Preferably, the functional blocks are activated by applying a full-speed clock to the functional block, and are deactivated by not applying the clock to the block. This is accomplished with a "modulated clock" which is derived from a regular output clock as modulated by signals supplied by the clock control lines.

However, U.S. Pat. No. 5,585,745 describes merely functional blocks in general and not a particular kind of block level or block size.

SUMMARY

An object of the present invention is to provide low power counters and counter blocks in order to reduce the power consumption problem.

This is accomplished by the low power counter according to the invention having low power counter blocks comprising flip-flops consuming a minimum of power when they are disabled and which are activated only when the value of the respective data output connection has to be changed.

Another object of the invention is to provide a low power n-bit binary coded counter (n−1 . . . 0) using low power binary counter blocks according to the invention, wherein bit i is changed and the flip-flop in the current block corresponding to the bit i is activated only if bit i−1 to 0 are all equal to "1".

Still another object of the invention is to provide a low power n-bit gray coded counter using low power gray coded counter blocks according to the invention. Two consecutive states representing two n-bit gray coded words (n−1 . . . 0) are called s0 and s1. In order to determine a word S2 in the state following the state presenting the word S1 the counter performs the following operations. Bit i (i<>n−1) is changed from s1 to s2 and the flip-flop in the block corresponding to the bit i is activated only if bit i in s1 and s0 are equal, bit i−1 in s1 is equal to "1", and bit i−2 to 0 in s1 are equal to "0". Bit n−1 is changed from s1 to s2 and the flip-flop in the block corresponding to the bit n is activated if bit n−1 in s1 and s0 are equal, and bit n−3 to 0 in s1 are equal to "0".

An advantage of the low power counters according to the invention is the reduction of power consumption.

BRIEF DESCRIPTION OF THE DRAWINGS

In order to explain the invention in more detail and the advantages and features of the invention preferred embodiments will be described in detail below, reference being made to the accompanying drawings, in which FIG. 3 is a table showing state coding for a 4-bit binary coded counter and a 4-bit gray coded counter.

DETAILED DESCRIPTION

Figure 1:
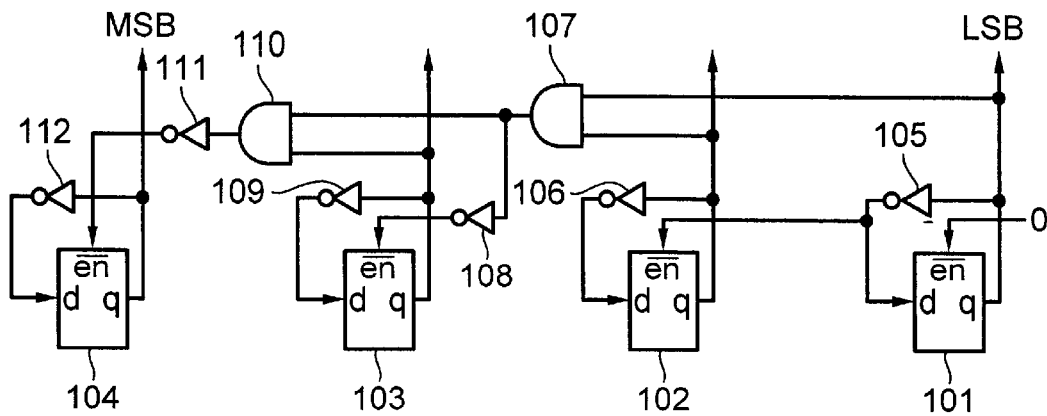
FIG. 1 is a block diagram of a low power 4-bit binary counter according to the present invention.

A first embodiment of a counter according to the invention is shown in FIG. 1. It is a synchronous low power 4-bit binary counter comprising 4 D flip-flops 101, 102, 103, and 104.

In the following description, numerous specific details, such as the number of bits in the counters are provided in order to give a more thorough description of the present invention. It will be obvious of those skilled in the art that the present invention may be practised without these specific details. Some well-known features are not described in detail so as not to make the present invention unclear.

The flip-flop 101 represents the least significant bit (LSB) and the flip-flop 104 the most significant bit (MSB). Each flip-flop in the counter has a clock input connection, not shown in the drawings, an enable input connection $\overline{en}$ (activated by a 0 value), a data input connection d, and a data output connection q.

In order to activate the flip-flop 101 its enable input connection $\overline{en}$ is set to 0. Its data output connection q represents the LSB and is connected to an input terminal of an inverter 105, an output terminal of which is connected to the data input connection d of the flip-flop 101 and the enable input connection $\overline{en}$ of the flip-flop 102. The data output connection q of the flip flop 102 represents the next more significant bit and is connected to an input terminal of an inverter 106, an output terminal of which is connected to the data input connection d of the flip-flop 102. The data output connections q of the flip-flops 101 and 102 are connected to the respective inputs of an AND gate 107, an output terminal of which is connected to an input terminal of an inverter 108 with an output terminal connected to the enable connection $\overline{en}$ of the next flip-flop 103.

The data output connection q of the flip-flop 103 represents the next more significant bit and is connected to an input terminal of an inverter 109, an output terminal of which is connected to the data input connection d of the flip-flop 103. The data output connections q of the flip-flop 103 and the output terminal of the AND gate 107 are connected to the respective inputs of an AND gate 110, an output terminal of which is connected to an input terminal of an inverter 111 with an output terminal connected to the enable connection $\overline{en}$ of the next flip-flop 104. The data output connection q of the flip-flop 104 represents the MSB of the embodiment of the 4-bit binary counter according to the invention and is connected to an input terminal of an inverter 112, an output terminal of which is connected to the data input connection d of the flip-flop 104.

Figure 2:
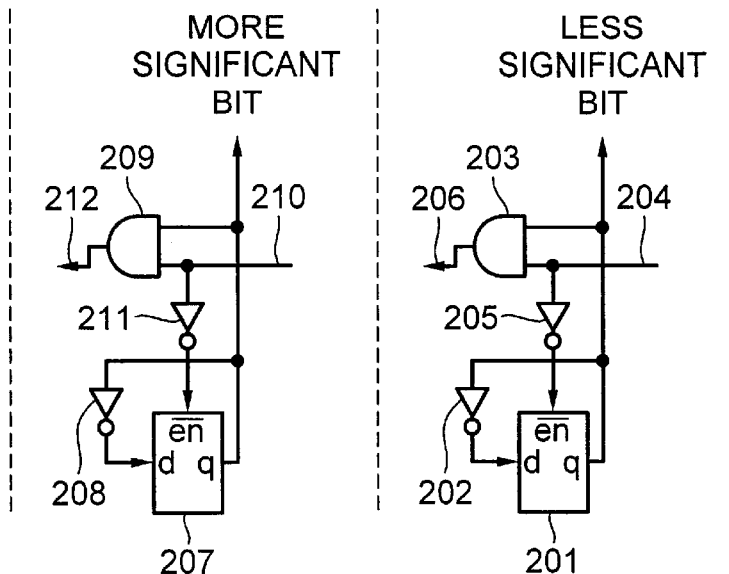
FIG. 2 shows two general building blocks for the counter in FIG. 1.

FIG. 2 shows two general building blocks or low power binary counter blocks of the embodiment of the low power 4-bit binary counter described above. The first block to the right represents a "less significant bit" and the second block to the left represents a "more significant bit". The right block comprises a flip-flop 201 having an enable input connection $\overline{en}$, a data input connection d and a data output connection q. The data output connection q of the flip flop 201 is connected to the input terminal of an inverter 202, an output terminal of which is connected to the data input connection d of the flip-flop 201. The data output connection q of the flip-flop 201 is connected to an 5 input terminal of a two input terminal AND gate 203. A block input terminal 204 is connected to another input terminal of the two input terminal AND gate 203 and an input terminal of another inverter 205, with its output terminal connected to the enable input connection $\overline{en}$ of the flip-flop 201. However, for the LSB this block input terminal 204 is set to "1". An output terminal of the AND gate 203 is connected to a block output terminal 206.

The second block to the left representing a "more significant bit" comprises the flip-flop 207 having an enable input connection $\overline{en}$, a data input connection d and a data output connection q. The data output connection q of the flip flop 207 is connected to the input terminal of an inverter 208, an output terminal of which is connected to the data input connection d of the flip-flop 207. The data output connection q of the flip-flop 207 is connected to an input terminal of a two input terminal AND gate 209. A block input terminal 210 connected to another input terminal of the two input terminal AND gate 209 and an input terminal of another inverter 211, with its output terminal connected to the enable input connection $\overline{en}$ of the flip-flop 207, is supplied by the block output terminal 206 of "the" AND gate of the block immediate to the right, i.e a less significant bit. An output terminal of the AND gate 209 is connected to a block output terminal 212. When the output terminal 212 has a high value "1" the counter is in its last state, i.e in state S15 (1111) for a 4-bit binary coded counter according to the embodiment shown in FIG 1. The flip-flops of the present invention are flip-flops consuming a minimum of power when disabled, i.e for example flip-flops in which the enable input gates the clock. For a binary counter according to the invention a particular flip-flop is activated only when it has to change the value of its output q. Considering an n-bit binary coded counter (n–1 . . . 0). Bit i is changed and the flip-flop in the block corresponding to the bit i is activated only if bit i–1 to 0 are all equal to "1". For a 4-bit counter going through the states (S0–S15) illustrated in a tabel shown in FIG. 3, for example bit 2 is changed if bit 1 and 0 are both equal to "1", as in state S3, S7, S11, and S15. An optimized block diagram of an embodiment of a 4-bit counter according to the invention based on this method is shown in FIG. 1.

Figure 4:
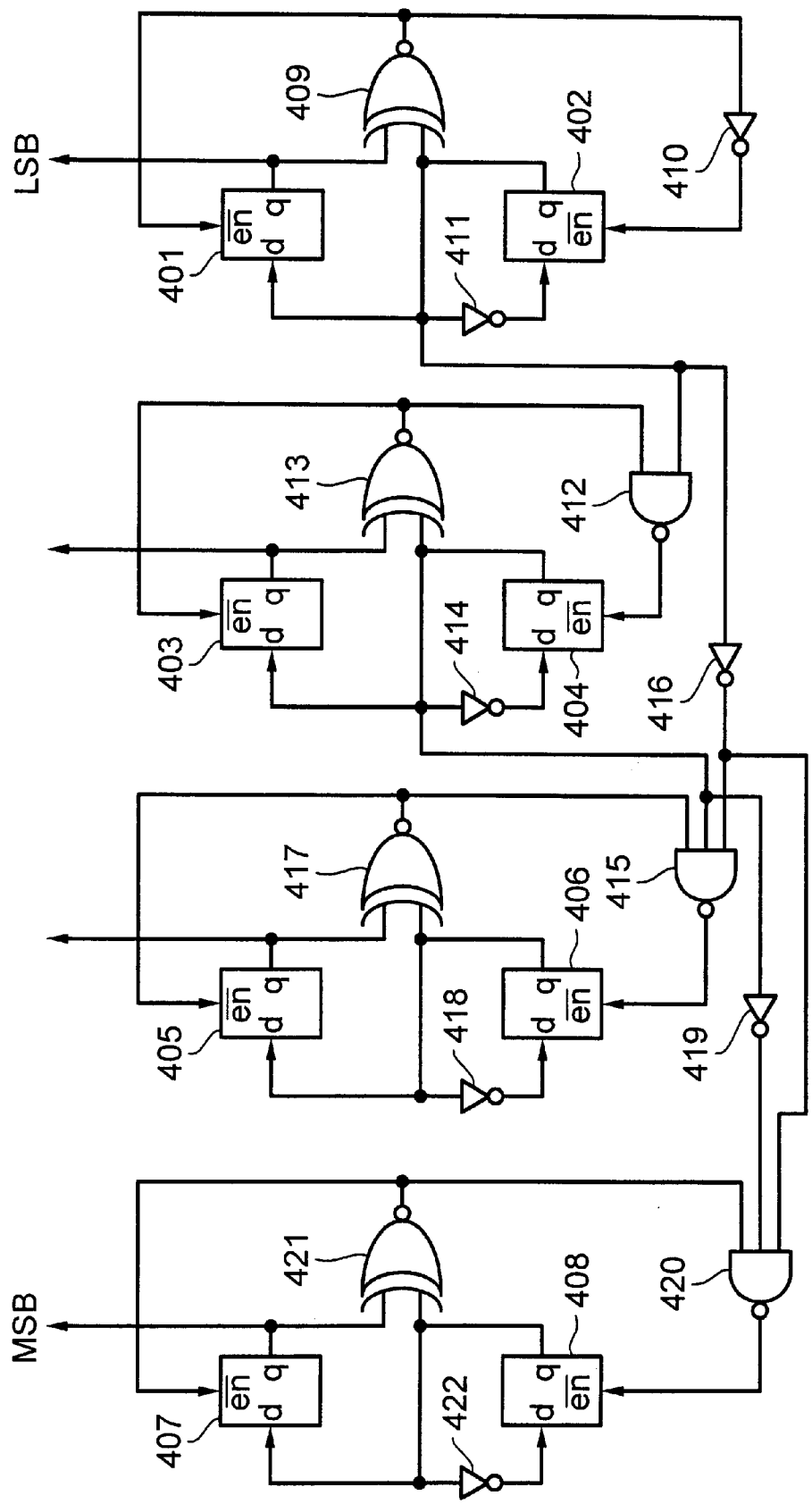
FIG. 4 is a block diagram of a low power 4-bit gray coded counter according to the present invention.

A block diagram of a second embodiment of the invention which is a synchronous low power 4-bit gray coded counter is shown in FIG. 4. The low power 4-bit gray coded counter comprises eight D flip-flops 401, 402, 403, 404, 405, 406, 407, and 408. Each flip-flop in the counter has a clock input connection, not shown in the drawings, an enable input connection $\overline{en}$ (activated with a 0 value), a data input connection d and a data output connection q.

The enable input connection $\overline{en}$ of the flip-flop 401 is connected to an output terminal of an EXNOR gate 409 and an input terminal of an inverter 410, the output of which is connected to the enable input connection $\overline{en}$ of the flip-flop 402. The data output connection q of the flip-flop 402 is connected to an input terminal of the EXNOR gate 409, an input terminal of an inverter 411, the data input connection d of the flip-flop 401, and an input terminal of a NAND gate 412 of the next block to the left in FIG. 4 representing a more significant bit. Further, an output terminal of the inverter 411 is connected to the data input connection of the flip-flop 402. The data output connection q of the flip-flop 401 represents the LSB or bit 0 and is also connected to another input of the EXNOR gate 409.

The enable input connection $\overline{en}$ of the flip-flop 403 is connected to an output terminal of an EXNOR gate 413 and an input terminal of the NAND gate 412, the output terminal of which is connected to the enable input connection $\overline{en}$ of the flip-flop 404. The data output connection q of the flip-flop 404 is connected to an input terminal of the EXNOR gate 413, an input terminal of an inverter 414, the data input connection d of the flip-flop 403, and a first input terminal of a NAND gate 415 of the next block to the left in FIG. 4 representing a more significant bit. An output terminal of the inverter 414 is connected to the data input connection of the flip-flop 404. The data output connection q of the flip-flop 403 represents the bit 1 and is also connected to another input of the EXNOR gate 413. Further, the data output connection q of the flip-flop 402 is also connected to another inverter 416, the output terminal of which is connected to a second input terminal of the NAND gate 415.

The enable input connection $\overline{en}$ of the flip-flop 405 is connected to an output terminal of an EXNOR gate 417 and a third input terminal of the NAND gate 415, the output terminal of which is connected to the enable input connection $\overline{en}$ of the flip-flop 406. The input connection d of the flip-flop 405 is connected to a first input terminal of the EXNOR gate 417, an input terminal of an inverter 418, and the data output connection q of the flip-flop 406. An output terminal of the inverter 418 is connected to the data input connection of the flip-flop 406. The data output connection q of the flip-flop 405 represents the bit 2 and is also connected to another input of the EXNOR gate 417. Further, the data output connection q of the flip-flop 404 is connected to an input terminal of an inverter 419. An output terminal of the inverter 419 is connected to a first input terminal of a NAND gate 420, the output terminal of which is connected to the enable input connection $\overline{en}$ of the flip-flop 408. The output terminal of the inverter 416 is also connected to a second input terminal of the NAND gate 420.

Finally, the enable input connection $\overline{en}$ of the flip-flop 407 is connected to an output terminal of an EXNOR gate 421 and a third input terminal of the NAND gate 420. The data output connection q of the flip-flop 408 is connected to an input terminal of the EXNOR gate 421, an input terminal of an inverter 422, and the data input connection d of the flip-flop 407. An output terminal of the inverter 422 is connected to the data input connection of the flip-flop 408. The data output connection q of the flip-flop 407 represents the MSB.

For this 4-bit counter, again referring to the the states in FIG. 3. For example S2=0011 and S3=0010, then S4=0110, since bit 2 in S2 and S3 are equal ("0"), bit 1 in S3 is equal to "1" and bit 0 in S3 is equal to "0". According to FIG. 4, the upper flip-flops 401, 403, 405 and 407 correspond to S2 and the lower flip-flops 402, 404, 406 and 408 correspond to S3 in a current state and in the next state the upper flip-flops 401, 403, 405 and 407 correspond to S3 and the lower flip-flops 402, 404, 406 and 408 correspond to S4.

Figure 5:
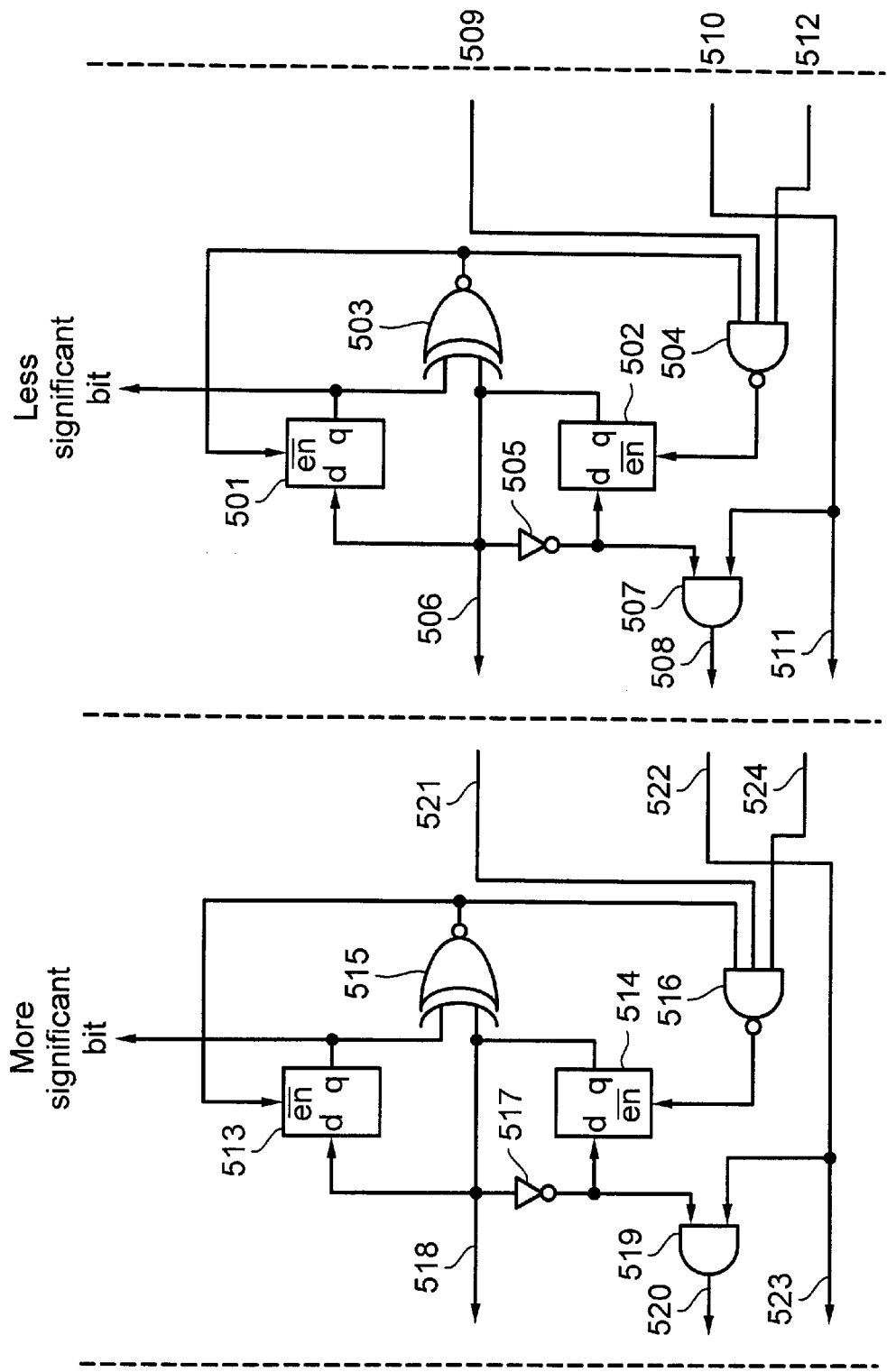
FIG. 5 shows two building blocks for the counter in FIG. 4.

FIG. 5 shows two general building blocks or the low power gray coded counter blocks of the embodiment of the low power 4-bit gray coded counter described above. The first block to the right represents a "less significant bit" and the second block to the left represents a "more significant bit". The right block comprises two flip-flops 501 and 502 each having an enable input connection $\overline{en}$, a data input connection d and a data output connection q.

The enable input connection $\overline{en}$ of the flip-flop 501 is connected to an output terminal of an EXNOR gate 503 and a first input terminal of a NAND gate 504, the output terminal of which is connected to the enable input connection $\overline{en}$ of the flip-flop 502. The data output connection q of the flip-flop 502 is connected to a first input terminal of the EXNOR gate 503, an input terminal of an inverter 505, the data input connection d of the flip-flop 501, and a first block output terminal 506 for the next block to the left in FIG. 5 representing a more significant bit. The data output connection q of the flip-flop 501 is connected to a second input terminal of the EXNOR gate 503 and represents the bit value of the current block. Further, an output terminal of the inverter 505 is connected to the data input connection of flip-flop 502 and a first input of an AND gate 507, the output terminal of which is a second block output terminal 508 for the next block. A first block input terminal 509 is connected to a second input terminal of the NAND gate 504, and a second block input terminal 510 is connected to a second input terminal of the AND gate 507, which is also connected to a third block output terminal 511. Finally, a third input terminal of the NAND gate 504 is connected to a third block input terminal 512.

The second block to the left representing a "more significant bit" comprises two flip-flops 513 and 514 each having an enable input connection $\overline{en}$, a data input connection d and a data output connection q.

The enable input connection $\overline{en}$ of the flip-flop 513 is connected to an output terminal of an EXNOR gate 515 and a first input terminal of a NAND gate 516, the output terminal of which is connected to the enable input connection $\overline{en}$ of the flip-flop 514. The data output connection q of the flip-flop 514 is connected to a first input terminal of the EXNOR gate 515, an input terminal of an inverter 517, the data input connection d of the flip-flop 513, and a first block output terminal 518 for the next block to the left representing a more significant bit. The data output connection q of the flip-flop 513 is connected to a second input terminal of the EXNOR gate 515 and represents the bit value of the current block. Further, an output terminal of the inverter 517 is connected to the data input connection of flip-flop 502 and a first input of an AND gate 519, the output terminal of which is a second block output terminal 520 for the next block. A first block input terminal 521 is connected to a second input terminal of the NAND gate 516, and a second block input terminal 522 is connected to a second input terminal of the AND gate 519, which is also connected to a third block output terminal 523. Finally, a third input terminal of the NAND gate 516 is connected to a third block input terminal 524.

In a counter the first, second, and third block output terminals 506, 508, and 511 of the "less significant bit" are connected to the first, second and third block input terminals 521, 522, and 524 of the "more significant bit", respectively.

However, there is no connection between the first block input terminal 521 of the MSB block and the first block output terminal 506 of the adjacent less significant bit. When the output terminal 520 has a high value "1" the counter is in its last state, i.e in state S15 (1000) for a 4-bit gray coded counter according to the embodiment shown in FIG. 4.

Further, the first, second, and third block input terminals 509, 510, 512 of the LSB are all set to "1".

The flip-flops used in the counter blocks are flip-flops consuming a minimum of power, as described above. The low power gray coded counter according to the invention operates as follows. Considering two consecutive states S0 and S1 representing two n-bit gray coded words (n−1 . . . 0) in the table in FIG. 3. In order to determine a word in a state S2 following the state S1 the counter performs the following steps.

Bit i (i<>n−1) is changed from S1 to S2 and the flip-flop in the block corresponding to the bit i is activated only if bit i in S1 and S0 are equal, bit i−1 in S1 is equal to "1", and bit i−2 to 0 in S1 are equal to "0". Bit n−1 is changed from S1 to S2 and the flip-flop in the block corresponding to the bit n−1 is activated if bit n−1 in s1 and s0 are equal, and bit n−3 to 0 in S1 are equal to "0".

Although the invention has been described by way of specific embodiments thereof it should be apparent that the present invention provides counters that fully satisfy the aims and advantages set forth above, and alternatives, modifications and variations are apparent to those skilled in the art.

Other flip-flops, such as JK or T flip-flops, or memory means can be utilized with minor alterations of the embodiments described.

The counters in the embodiments described above count +1 every clock cycle. However, within the scope of the invention it is possible to extend the enable conditions for the flip-flops with an external signal so that the counters can be enabled and disabled.

The counters count modulo $2^i$, where i is the number of bits. By extending the enable conditions, the counter can be configured to count modulo x, where $0 < x < 2^i$.

The size of the counters according to the invention increases linearity with the number of bits.

Figures 6, 7:
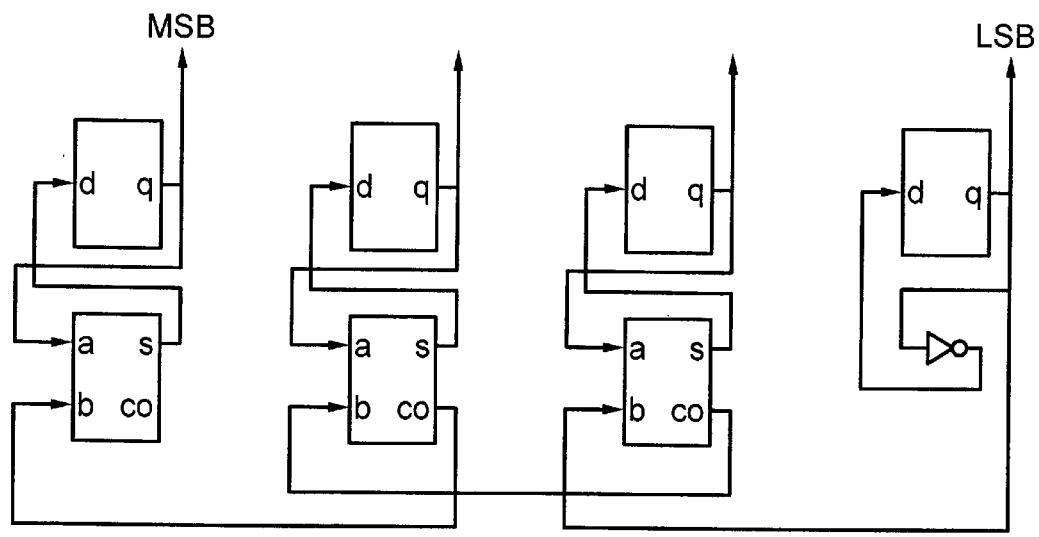
FIG. 6 is a table showing the size and power dissipation of prior art counters compared to the counters according to the invention.
FIG. 7 is a block diagram of a prior art 4-bit binary counter.
Figure 8A:
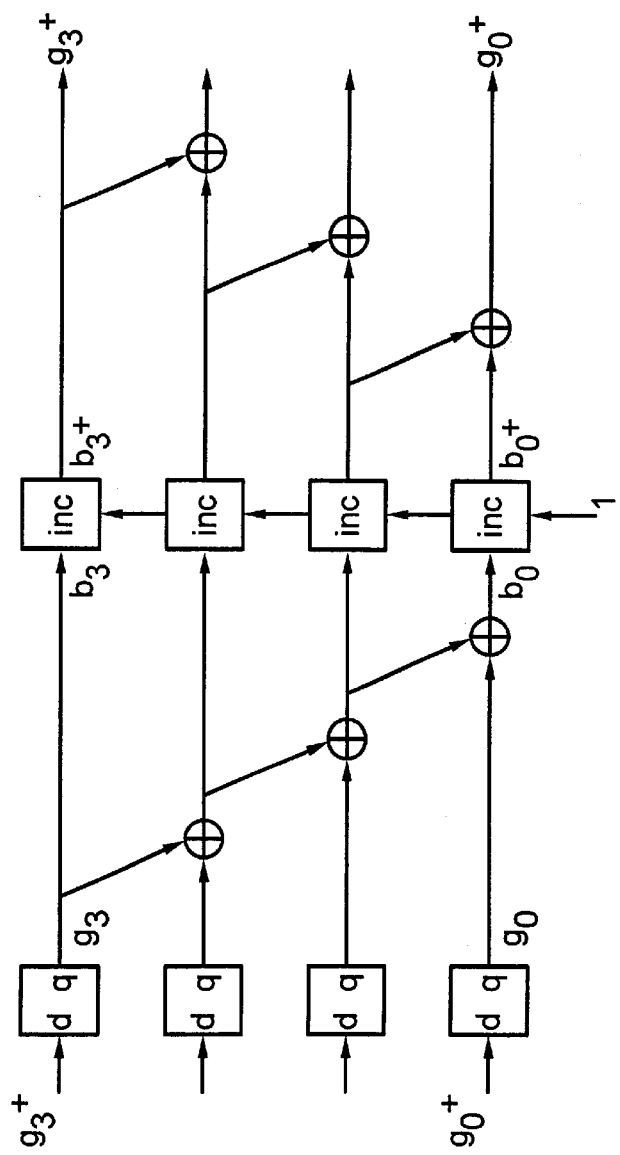
FIG. 8A is a block diagram of a prior art 4-bit gray coded counter.
Figure 8B:
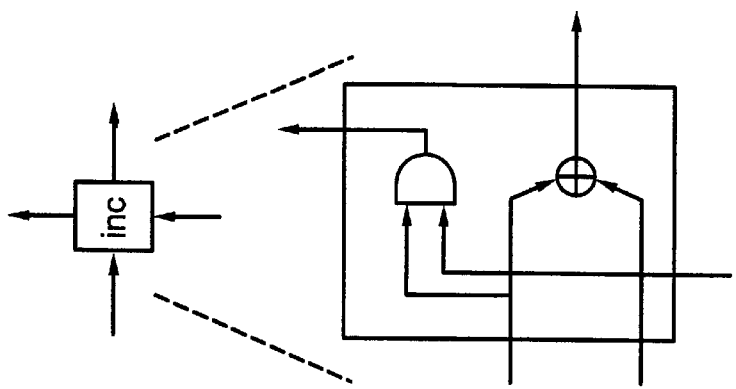
FIG. 8B shows the increment (inc) block of the counter in FIG. 8A in detail.

The table shown in FIG. 6 illustrates comparison between different 10-bit counters. The counters according to the invention are called Low Power Binary and Low Power Gray, respectively. These counters are compared with two prior art counters, RCA Binary and GB Gray in the table in FIG. 6. The RCA Binary counter including a ripple carry adder is shown in FIG. 7 and the GB Gray coded counter is shown in FIG. 8A. An inc block of the GB Gray coded counter is shown in detail in FIG. 8B. The GB Gray coded counter converts the gray coded word to a binary word, increments it and converts it back to a gray coded word.

It is understood from the table in FIG. 6 that the power consumption is reduced with more than 50 percent by using the counters according to the invention.

What is claimed is:

1. A low power counter for cycling through a predetermined sequence of states in response to pulses on an input line comprising a number of low power binary counter blocks corresponding to the number of bits of the counter, the low power binary counter blocks being connected in series and each comprising a flip-flop as memory means consuming a minimum amount of power when disabled and which is activated only when a value of a respective data output connection of the memory means has to be changed, in which a data output connection of the flip-flop is connected to an input terminal of a first inverter, an output terminal of which is connected to a data input connection of the flip-flop, the data output connection of the flip-flop being further connected to an input terminal of an AND gate, an output terminal of which is connected to a block output terminal, a block input terminal being connected to another input terminal of the AND gate and an input terminal of a second inverter, the output terminal thereof being connected to an enable input connection of the flip-flop.

2. A low power counter for cycling through a predetermined sequence of states in response to pulses on an input line, comprising a number of low power gray coded counter blocks corresponding to the number of bits of the counter the low power gray coded counter blocks being connected in series and each comprising a pair of flip-flops as memory means in which an enable input connection of a first flip-flop is connected to an output terminal of an EXNOR gate and a first input terminal of a NAND gate, the output terminal of which is connected to the enable input connection of a second flip-flop, the data output connection of the second flip-flop is connected to a first input terminal of the EXNOR gate, an input terminal of an inverter, the data input connection of the first flip-flop and a first block output terminal, the data output connection of the first flip-flop is connected to a second input terminal of the EXNOR gate and represents the bit value of a current block, an output terminal of the inverter is connected to a data input connection of the second flip-flop a first input of an AND gate, the output terminal of which is a second block output terminal, a first block input terminal is connected to a second input terminal of the NAND gate, a second block input terminal is connected to a second input terminal of the AND gate which is also connected to a third block output terminal, and a third input terminal of the NAND gate is connected to a third block input terminal.

3. A low power counter for cycling through a predetermined sequence of states in response to pulses on an input line, comprising a number of counter blocks, corresponding to the number of bits of the counter, connected in series, the low power counter blocks including memory means consuming a minimum of power when they are disabled, wherein the counter is a binary counter and the counter blocks are interconnected so that the memory means of the counter block corresponding to a bit i in the counter, is activated and its output is changed only if the bits (i−1) through a bit 0 of the counter are logically high.

4. A low power counter according to claim 3, wherein each counter block comprises a flip-flop as memory means, in which a data output connection of the flip-flop is connected to an input terminal of a first inverter, an output terminal of which is connected to a data input connection of the flip-flop, wherein the data output connection of the flip-flop is connected to an input terminal of an AND gate, an output terminal of which is connected to a block output terminal, a block input terminal being connected to another input terminal of the AND gate and an input terminal of a second inverter, and the output terminal of the inverter being connected to an enable input connection of the flip-flop.

5. A low power counter for cycling through a predetermined sequence of states in response to pulses on an input line, comprising a number of low power counter blocks, corresponding to the number of bits of the counter, connected in series, the low power counter blocks including memory means consuming a minimum of power when they are disabled, wherein the counter is a gray coded counter capable of assuming a number of different states, wherein three consecutive states S0, S1 and S2 correspond to three, n-bit Gray coded words (n−1, . . . 0), the counter blocks being interconnected so that the memory means of the counter block corresponding to a bit i in the counter, where i is not equal to n−1, is activated and changed from the state S1 to S2 only if bit i in S1 and S0 are equal, bit i−1 in S1 is logically high, and bit i−2 through bit 0 in S1 are logically low, the memory means in the block corresponding to bit n−1 being activated and changed from S1 to S2 if bit n−1 in S1 and S0 are equal, and the bits n−3 to bit 0 in S1 are logically low.

6. A low power counter according to claim 5, wherein each counter block comprises a first flip-flop with an enable input connection of a first flip-flop is connected to an output terminal of an EXNOR gate and a first input terminal of a NAND gate, the output terminal of which is connected to the enable input connection of a second flip-flop, the data output connection of the second flip-flop is connected to a first input terminal of the EXNOR gate, an input terminal of an inverter, the data input connection of the first flip-flop and a first block output terminal, the data output connection of the first flip-flop is connected to a second input terminal of the EXNOR gate and represents a bit value of a respective block, an output terminal of the inverter is connected to a data input connection of the second flip-flop a first input of an AND gate, the output terminal of which is a second block output terminal, a first block input terminal is connected to a second input terminal of the NAND gate, a second block input terminal is connected to a second input terminal of the AND gate which is also connected to a third block output terminal, and a third input terminal of the NAND gate is connected to a third block input terminal.

* * * * *